United States Patent [19]

Hainz et al.

[11] Patent Number: 5,138,428
[45] Date of Patent: Aug. 11, 1992

[54] CONNECTION OF A SEMICONDUCTOR COMPONENT TO A METAL CARRIER

[75] Inventors: Oswald Hainz, Burglengenfeld; Bernard Zuhr, Regensburg, both of Fed. Rep. of Germany

[73] Assignee: Siemens Aktiengesellschaft, Munich, Fed. Rep. of Germany

[21] Appl. No.: 531,298

[22] Filed: May 31, 1990

[30] Foreign Application Priority Data

May 31, 1989 [EP] European Pat. Off. ............ 89109836

[51] Int. Cl.$^5$ ...................... H01L 23/12; H01L 23/14
[52] U.S. Cl. .......................................... 357/68; 357/81; 357/67
[58] Field of Search .................. 357/74, 81, 70, 67, 357/68

[56] References Cited

U.S. PATENT DOCUMENTS

| | | | |
|---|---|---|---|
| 4,123,293 | 10/1978 | Okikawa et al. | 357/81 |
| 4,392,151 | 7/1983 | Iwatani | 357/70 |
| 4,572,924 | 2/1986 | Wakely et al. | 357/74 |
| 4,589,010 | 5/1986 | Tateno et al. | 357/70 |
| 4,604,642 | 8/1986 | Sakurai | 357/70 |
| 4,845,543 | 7/1989 | Okikawa et al. | 357/70 |
| 4,872,047 | 10/1989 | Fister et al. | 357/67 |
| 4,899,210 | 2/1990 | Lorenzetti et al. | 357/81 |
| 4,952,999 | 8/1990 | Robinson et al. | 357/70 |

FOREIGN PATENT DOCUMENTS

| | | | |
|---|---|---|---|
| 57-133655 | 8/1982 | Japan | 357/70 |
| 58-207645 | 12/1983 | Japan | 357/70 |
| 59-134837 | 8/1984 | Japan | 357/70 |
| 62-15844 | 1/1987 | Japan | 357/70 |
| 1-102947 | 4/1989 | Japan | 357/70 |

*Primary Examiner*—Rolf Hille
*Assistant Examiner*—S. V. Clark
*Attorney, Agent, or Firm*—Hill, Van Santen, Steadman & Simpson

[57] ABSTRACT

A reliable connection of a semiconductor component to a metal carrier is provided which avoids damage during bonding. A buffer material is applied between the semiconductor component and the metal carrier. Means are provided for fixing the buffer material during the bonding, such as a roughening of one or both surfaces in contact with the buffer material. Also, the metal carrier has a stiffening structure. Also, a weakening of the metal carrier can serve to increase the flexibility of the metal carrier and prevent damage thereto during bonding.

17 Claims, 4 Drawing Sheets

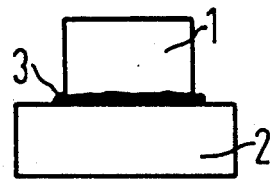
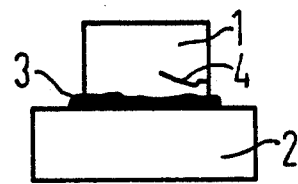
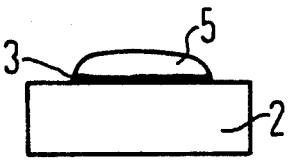
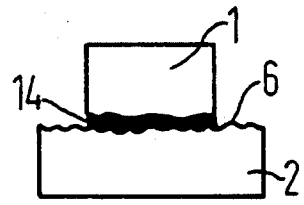
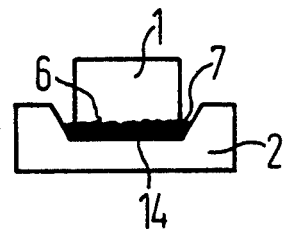
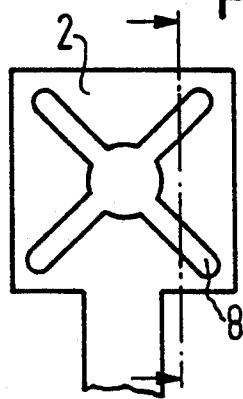
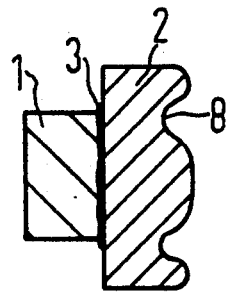

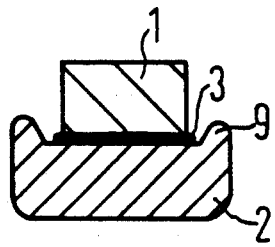
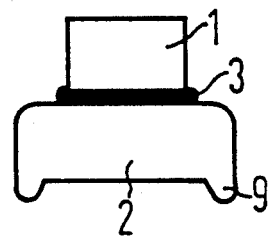
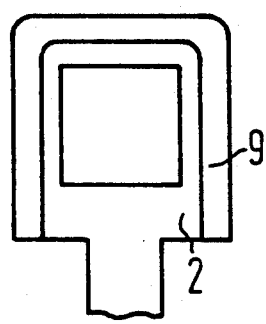
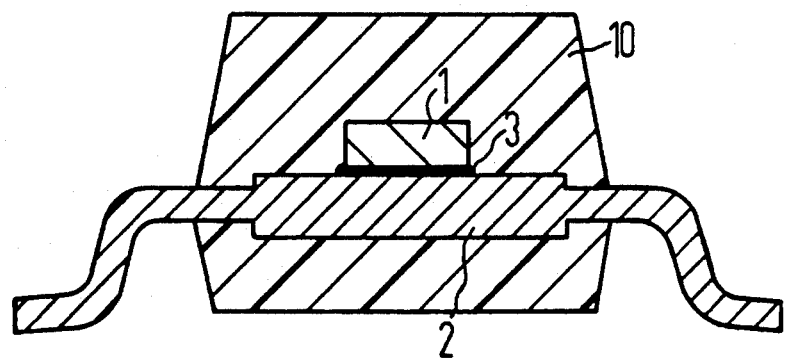
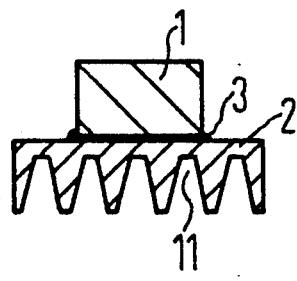

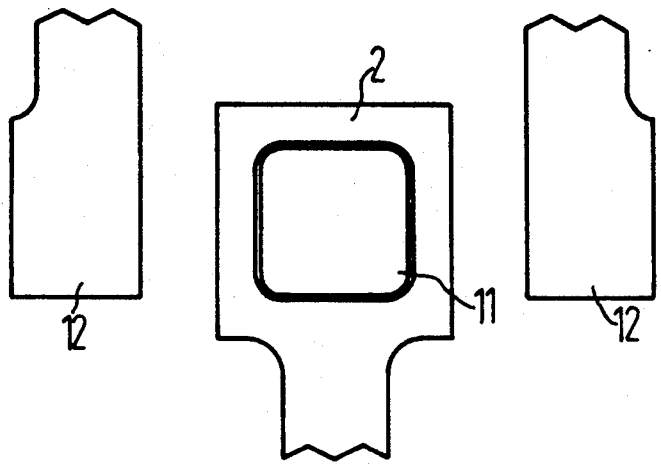
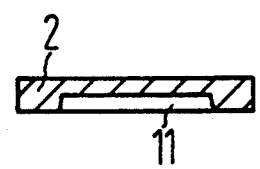
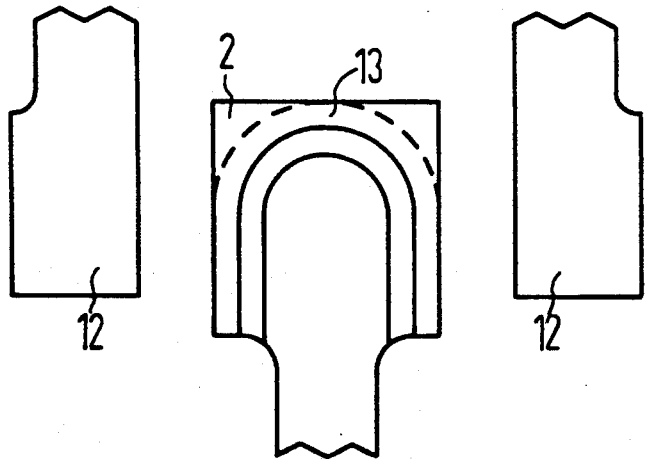
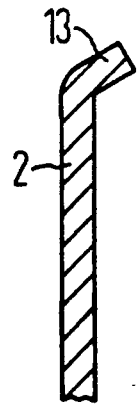

CONNECTION OF A SEMICONDUCTOR COMPONENT TO A METAL CARRIER

BACKGROUND OF THE INVENTION

The invention is directed to a connection of a semiconductor component to a metal carrier. Components are being produced to an increasing extent on the basis of solid-state technology in the electronics industry. Bonding (die bonding) of a silicon chip to a carrier of copper or of some other metal such as, for example, steel is required in numerous component types for achieving functionability. The internal stresses that occur given a bonding temperature of approximately 370° C. very frequently lead to a destruction of the connection and can modify the electrical properties of the semiconductor component. For example an overload can occur as a consequence of a deteriorated thermal conduction.

The publication entitled "Deformationen und innere Spannungen beim Bonden von Festkoerperschaltkreisen" has appeared in the periodical "Feingeraetetechnik", Vol. 25, No. 5, 1976, pages 198-200, incorporated herein by reference.

Due to different coefficients of elongation of semiconductor component and metal carrier, such great stresses can occur when cooling the connection from the alloying temperature to room temperature that the semiconductor component explodes off and/or that incipient cracks arise in the semiconductor component. The probability that the semiconductor component will be destroyed or damaged becomes all the higher, the greater the bending radius of the semiconductor component during cooling.

SUMMARY OF THE INVENTION

An object of the present invention is to specify a connection of the type initially cited with which a reliable connection between semiconductor component and metal carrier can be achieved.

This object is achieved according to the invention by a connection system wherein a semiconductor component is provided having a mounting surface; a metal carrier is provided having a component receiving surface; and a buffer material is provided between the surfaces of the semiconductor component and metal carrier. At least one of the surfaces of the semiconductor component and metal carrier adjoining the buffer material have a structure associated therewith for retaining or fixing the buffer material when the semiconductor component is bonded to the metal carrier.

The present invention can be employed with particular advantage for realizing a reliable semiconductor-to-chip connection on the basis of eutectic alloying of a silicon chip on a copper carrier band by use of a gold layer on the backside of the semiconductor component.

The present invention is especially advantageous for the production of surface-mountable components (surface-mounted devices).

The employment of the present invention is especially advantageous given metal carriers that are relatively thin (thinner than 250 $\mu$m, especially thinner than 150 $\mu$m). The present invention is therefore especially advantageous for the manufacture of SOT 23 components.

The invention permits the use of thinner and/or more cost-beneficial metal carriers. A large part of the costs in the manufacture of the semiconductor components in lead-frame technology is to be attributed to the cost of the lead frame (metallic carrier).

The invention is especially advantageous for the direct bonding of a silicon semiconductor component to a copper carrier with the assistance of a gold-silicon eutectic between the semiconductor component and the copper carrier.

The employment of a thick gold layer (2–5 $\mu$m, particularly 3.5 $\mu$m thick) as a buffer material between the semiconductor component and the metal carrier is especially advantageous. Soft material that can creep and that can relieve stresses can be employed as the buffer material. In die bonding, solder is pressed out between the semiconductor component and the metal carrier. What is achieved by a profiling of the metal carrier is that the solder is held back between the semiconductor component and the metal carrier.

A partial thickening of the metal carrier is advantageous for the invention.

Both a bending stress as well as a tensile stress occur when cooling from the soldering temperature to room temperature. Stresses can be relieved by partial stiffenings of the metal carrier and/or with the assistance of a buffer material between the semiconductor component and the metal carrier.

A buffer material should be applied in such a thickness that it can contribute to the relieving of stresses. However, a buffer material should not be excessively thick in order to avoid excessive, additional costs. When using a thicker layer as a buffer material, the buffer material can be prevented from running out from the region between the semiconductor component and the metal carrier on the basis of a multitude of various techniques. For this purpose, a structure that allows an adequate quantity of solder to be fixed between the semiconductor component and the metal carrier can be applied to the backside of a semiconductor component and/or to the front side of the metal carrier on which the semiconductor component is to be applied. Such a surface structure can comprise striae and/or grooves and/or channels and/or at least one cavity and/or some other roughness. Such a surface structure can be achieved by stamping or engraving, by shaping, or by roughening. The depth of the surface structure can be in a range from 10 $\mu$m, and particularly between 2 and 5 $\mu$m.

Partial stiffenings of the metal carrier can be produced by profiles, by beads, or by thickened portions.

The reliability of the connection between a semiconductor component and a metal carrier can also be increased in that the flexibility of the metal carrier is increased by weakening the metal carrier. For example, the metal carrier can be provided with thinner regions to such an extent that it can be bend.

BRIEF DESCRIPTION OF THE DRAWINGS

FIGS. 1 through 3 explain the underlying problem which is solved by the invention;

FIGS. 4 through 9 explain various techniques of the invention; and

FIGS. 10 through 19 show exemplary embodiments of metal carriers of the invention.

DESCRIPTION OF THE PREFERRED EMBODIMENTS

Figure 10:
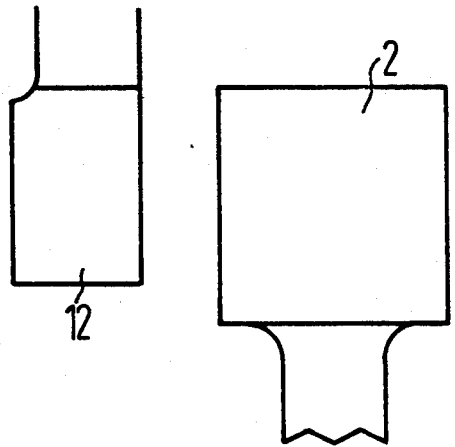
Figure 11:
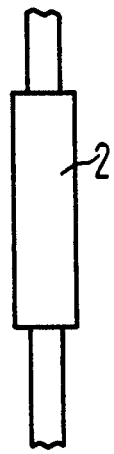

FIG. 1 shows the connection of a semiconductor component 1 to a metal carrier 2 with a gold backside 3 of the semiconductor component 1. For example, a silicon chip 1 is bonded to a copper band 2 (die bonding) with the assistance of a gold-silicon eutectic at a bonding temperature of approximately 370° C.

Due to different coefficients of elongation of silicon and copper, such high stresses can occur when cooling the connection from the alloying temperature to room temperature that incipient cracks 4 (FIG. 2) arise in the silicon component, or that the silicon chip explodes off. Only a silicon residue 5 (FIG. 3) remains on the metal carrier 2 after the explosion of the silicon chip.

FIG. 4 shows the employment of a buffer material 14 between the semiconductor component 1 and metal carrier 2. Any soft material that is suitable for relieving stresses can be employed as buffer material 14. For example, a 3 $\mu$m thick gold backside on the semiconductor component 1 can serve as buffer material 14. The buffer material 14 can be prevented from running out from the region between the semiconductor component 1 and the metal carrier 2 during die bonding by producing a roughness 6 having a depth of approximately 2-5 $\mu$m on the metal carrier. For example, the roughness 6 can be produced by embossing, engraving, or stamping. The buffer material 14 can also be prevented from running out by employing a cavity 7 at the backside of the semiconductor component 1 and/or at the front side of the metal carrier 2. A roughness 6 can also be applied on the backside of the semiconductor component 1.

FIGS. 5 through 8 explain an increase in the stiffness of the metal carrier 2 on the basis of stiffenings or reinforcements. In FIG. 5, the stiffness of the metal carrier 2 is achieved with stamped, embossed, or engraved beads 8. In FIG. 6 and FIG. 7, an increase in the band stiffness is achieved by a profiling 9 of the metal carrier 2. In FIG. 6, the semiconductor component 1 is thereby connected to the profiled side of the metal carrier 2 and, in FIG. 7, it is connected to that side opposite the profiled side of the metal carrier 2.

FIG. 8 shows a metal carrier 2 that is thickened in the region of the connection between the semiconductor component 1 and the metal carrier 2 partially on the basis of a geometry modification. For example, a copper band that otherwise has a thickness of 100 or 125 $\mu$m (SOT 23) can be thickened to a thickness 200 $\mu$m in a region of the connection of the semiconductor component 1. The surface-mountable component of FIG. 8 has an envelope 10.

FIG. 9 explains the increase in the flexibility of the metal carrier 2 by weakening the metal carrier 2. Stampings, depressions or engravings are thereby applied to the metal carrier 2. When the metal carrier 2 has a standard thickness of 100 or 125 $\mu$m, it can have a residual thickness of, for example, 20-50 $\mu$m within the stampings or depressions 11. Other residual thicknesses are also possible, particularly in combination with other techniques in the framework of this invention.

FIG. 10 shows a metal carrier 2 given a SOT 23 band that has a thickness of approximately 250 $\mu$m in the region of the connection to a semiconductor component 1, whereas the metal band has a thickness of 125 $\mu$m in its remaining region. The bending stress between the semiconductor component 1 and metal carrier 2 can be eliminated with this partial stiffening. The bending stress can also be eliminated by a combination of stiffening the metal carrier 2 and buffer material 14 between the semiconductor component 1 and the metal carrier 2. In addition to having the metal carrier 2, the lead frame also has the bond areas 12 for the electrical connection to the semiconductor component 1 with the assistance of bond wires.

Figure 12:
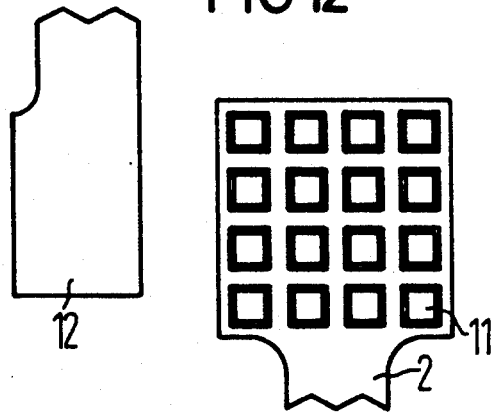
Figure 13:
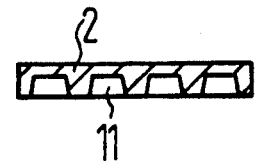

FIGS. 12 and 13 show a metal carrier 2 wherein depressions 11 are applied in checkerboard fashion for increasing the band flexibility. When the metal carrier 2 has a thickness of 125 $\mu$m, then the metal carrier 2 has only a residual thickness of 45 $\mu$m in the region of the stiffenings. The stampings or depressions are advantageously executed in a pyramid shape.

Figure 14:
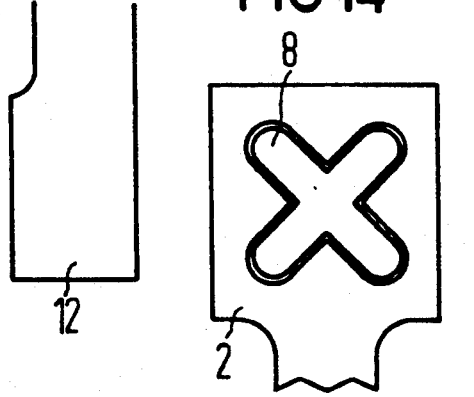
Figure 15:
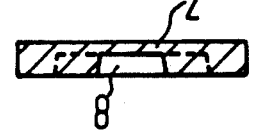

FIGS. 14 and 15 show a metal carrier 2 having beads 8. The metal carrier 2 has depressions in the regions of the beads 8.

FIGS. 16 and 17 show a metal carrier wherein the depression 11 is executed such that a profiled metal carrier 2 has arisen. Whereas the depressions 8 or 11 are applied onto the backside of the metal carrier 2 in FIGS. 12 and 14, the depressions in FIGS. 16 and 18 are produced on the front side of the metal carrier 2. In FIG. 16, thus the semiconductor component I is bonded n the depression 11.

FIGS. 18 and 19 show a metal carrier 2 having a bead 13. All depressions or beads in FIGS. 12 through 19 can be achieved by stamping, engraving, or embossing.

A reliable connection between semiconductor component 1 and metal carrier 2 can be achieved by employing a buffer material, by partially stiffening the metal carrier, by increasing the flexibility of the metal carrier on the basis of a weakening of the metal carrier, and by an arbitrary combination of these techniques.

Although various minor changes and modifications might be proposed by those skilled in the art, it will be understood that we wish to include within the claims of the patent warranted hereon all such changes and modifications as reasonably come within our contribution to the art.

We claim as our invention:

1. A connection system, comprising:
    a semiconductor component having a mounting surface;
    a metal carrier having a component receiving surface;
    a buffer material means between the surfaces of the semiconductor component and metal carrier for allowing a creeping movement between the surfaces to relieve stresses during bonding of the component to the carrier caused by different coefficients of elongation of the semiconductor component and metal carrier during cooling, said buffer material means having at thickness between 2 and 5 $\mu$m; and
    at least one of the surfaces of the semiconductor component and the metal carrier adjoining the buffer material means having structure means for fixing the buffer material means when the semiconductor is bonded to the metal carrier.

2. A connection system according to claim 1 wherein the structure means of the surface has a depth between 1 and 10 $\mu$m.

3. A connection system according to claim 2 wherein the structure means of the surface has a depth between 2 and 5 $\mu$m.

4. A connection system according to claim 1 wherein the buffer material means comprises gold.

5. A connection system, comprising:
    a semiconductor component having a mounting surface;
    a metal carrier having a component receiving surface;
    a buffer material means between the surfaces of the semiconductor component and metal carrier for allowing a creeping movement between the surfaces to relieve stresses during bonding of the component to the carrier caused by different coefficients of elongation of the semiconductor component and metal carrier during cooling;

at least one of the surfaces of the semiconductor component and the metal carrier adjoining the buffer material means having structure means for fixing the buffer material means when the semiconductor is bonded to the metal carrier; and the buffer material means comprising a gold layer having a thickness between 2 and 5 µm.

6. A connection system, comprising:

a semiconductor component having a mounting surface;

a metal carrier having a component receiving surface;

a buffer material means between the surfaces of the semiconductor component and metal carrier for allowing a creeping movement between the surfaces to relieve stresses during bonding of the component to the carrier caused by different coefficients of elongation of the semiconductor component and metal carrier during cooling, said buffer material means having at thickness between 2 and 5 µm;

at least one of the surfaces of the semiconductor component and the metal carrier adjoining the buffer material means having structure means for fixing the buffer material means when the semiconductor component is bonded to the metal carrier; and the metal carrier having stiffening means for preventing a bending stress as a result of cooling when the component is bonded to the metal carrier.

7. A connection system according to claim 6 wherein the stiffening means comprises at least one bead.

8. A connection system according to claim 6 wherein the stiffening means comprises at least one profiling.

9. A connection system according to claim 6 wherein the stiffening means has a rib-like longitudinal extent.

10. A connection system according to claim 6 wherein the stiffening means comprises a geometry modification of the metal carrier.

11. A connection system, comprising:

a semiconductor component having a mounting surface;

a metal carrier having a component receiving surface;

a buffer material means between the surfaces of the semiconductor component and metal carrier for allowing a creeping movement between the surfaces to relieve stresses during bonding of the component to the carrier caused by different coefficients of elongation of the semiconductor component and metal carrier during cooling, said buffer material means having at thickness between 2 and 5 µm;

at least one of the surfaces of the semiconductor component and the metal carrier adjoining the buffer material means having structure means for fixing the buffer material means when the semiconductor is bonded to the metal carrier; and the metal carrier having means for weakening the metal carrier for increasing a flexibility thereof for increasing a reliability of a connection between the semiconductor component and the metal carrier.

12. A connection system according to claim 11 wherein the weakening means comprises a plurality of depressions face of the metal carrier opposite the component receiving surface which reduce a thickness of the carrier at the depressions.

13. A connection system according to claim 12 wherein the depressions are channel-like.

14. A connection system, comprising:

a semiconductor component having a mounting surface;

a metal carrier having a component receiving surface;

a buffer material means between the surfaces of the semiconductor component and the metal carrier for allowing movement between the surfaces to relieve stresses during bonding of the component to the carrier caused by different coefficients of elongation of the semiconductor component and metal carrier during cooling, said buffer material means having at thickness between 2 and 5 µm; and the metal carrier having means for retaining the buffer material means between the metal carrier and semiconductor component when the semiconductor component is bonded to the metal carrier and to reduce a spreading out of the buffer material means during the bonding.

15. A connection system according to claim 14 wherein said means comprises a roughening of the component surface of the metal carrier.

16. A connection system according to claim 14 wherein said means comprises a cavity in the metal carrier within which the buffer material is provided, walls of the cavity reducing a spreading out of the buffer material.

17. A connection system according to claim 14 wherein the buffer material comprises a gold-silicon eutectic.

* * * * *